(12) United States Patent
Ogawa

(10) Patent No.: US 8,040,430 B2
(45) Date of Patent: Oct. 18, 2011

(54) BATTERY CAPACITY DISPLAY DEVICE AND CAMERA

(75) Inventor: Hidehiro Ogawa, Funabashi (JP)

(73) Assignee: Nikon Corporation, Tokyo (JP)

( * ) Notice: Subject to any disclaimer, the term of this patent is extended or adjusted under 35 U.S.C. 154(b) by 906 days.

(21) Appl. No.: 10/890,992

(22) Filed: Jul. 15, 2004

(65) Prior Publication Data

US 2005/0013604 A1    Jan. 20, 2005

(30) Foreign Application Priority Data

Jul. 18, 2003  (JP) ................................ 2003-276643
Jul. 18, 2003  (JP) ................................ 2003-276644

(51) Int. Cl.
*H04N 5/225* (2006.01)
*H02J 7/00* (2006.01)

(52) U.S. Cl. .................. 348/372; 348/333.13; 348/375; 320/106; 320/132

(58) Field of Classification Search ............ 348/208.15, 348/211.13, 333.02, 333.04, 372, 331.13, 348/231.3; 320/132, 149, 106, 112, 136, 320/134; 345/211
See application file for complete search history.

(56) References Cited

U.S. PATENT DOCUMENTS

| | | | | |
|---|---|---|---|---|
| 5,018,017 A | * | 5/1991 | Sasaki et al. ............... | 348/231.3 |
| 5,278,487 A | | 1/1994 | Koenck | |
| 5,281,955 A | | 1/1994 | Reich et al. | |
| 5,654,623 A | * | 8/1997 | Shiga et al. ................... | 320/106 |
| 5,789,901 A | | 8/1998 | Lomholt | |
| 5,845,142 A | | 12/1998 | Hayasaka | |
| 6,067,171 A | | 5/2000 | Yamada et al. | |
| 6,114,833 A | | 9/2000 | Langston et al. | |
| 6,384,572 B1 | * | 5/2002 | Nishimura ..................... | 320/106 |
| 6,498,459 B1 | * | 12/2002 | Okumura et al. ............. | 320/128 |
| 6,522,361 B2 | * | 2/2003 | Higuchi et al. ................ | 348/372 |
| 7,102,684 B1 | * | 9/2006 | Higuchi et al. ................ | 348/372 |
| 7,148,655 B2 | * | 12/2006 | Ebato et al. .................... | 320/132 |
| 2001/0008424 A1 | * | 7/2001 | Higuchi et al. ............... | 348/372 |
| 2004/0104706 A1 | * | 6/2004 | Ooi et al. ....................... | 320/132 |

FOREIGN PATENT DOCUMENTS

| | | |
|---|---|---|
| EP | 1 113 561 A1 | 7/2001 |
| EP | 1 150 485 A2 | 10/2001 |
| JP | A 9-139707 | 5/1997 |
| JP | A 9-236852 | 9/1997 |
| JP | A 11-355700 | 12/1999 |
| JP | A-2001-257969 | 9/2001 |
| JP | A-2002-262168 | 9/2002 |
| JP | A-2002-300444 | 10/2002 |
| JP | A-2003-84050 | 3/2003 |
| JP | A-2004-69922 | 3/2004 |

* cited by examiner

*Primary Examiner* — Sinh Tran
*Assistant Examiner* — Selam Gebriel
(74) *Attorney, Agent, or Firm* — Oliff & Berridge, PLC

(57) ABSTRACT

A battery capacity display device for an electronic apparatus, includes: a nonvolatile storage unit that stores information related to a remaining capacity in a rechargeable battery output from a battery module having the rechargeable battery and an arithmetic operation unit that calculates the information related to the remaining capacity in the rechargeable battery based upon a value of an electrical current flowing to the rechargeable battery; a display unit that displays the remaining capacity in the rechargeable battery based upon the information related to the remaining capacity; and a display control unit that controls the display unit so as to display the remaining capacity based upon the information related to the remaining capacity stored at the storage unit at least until the information related to the remaining capacity is output from the battery module following a startup of the electronic apparatus.

8 Claims, 9 Drawing Sheets

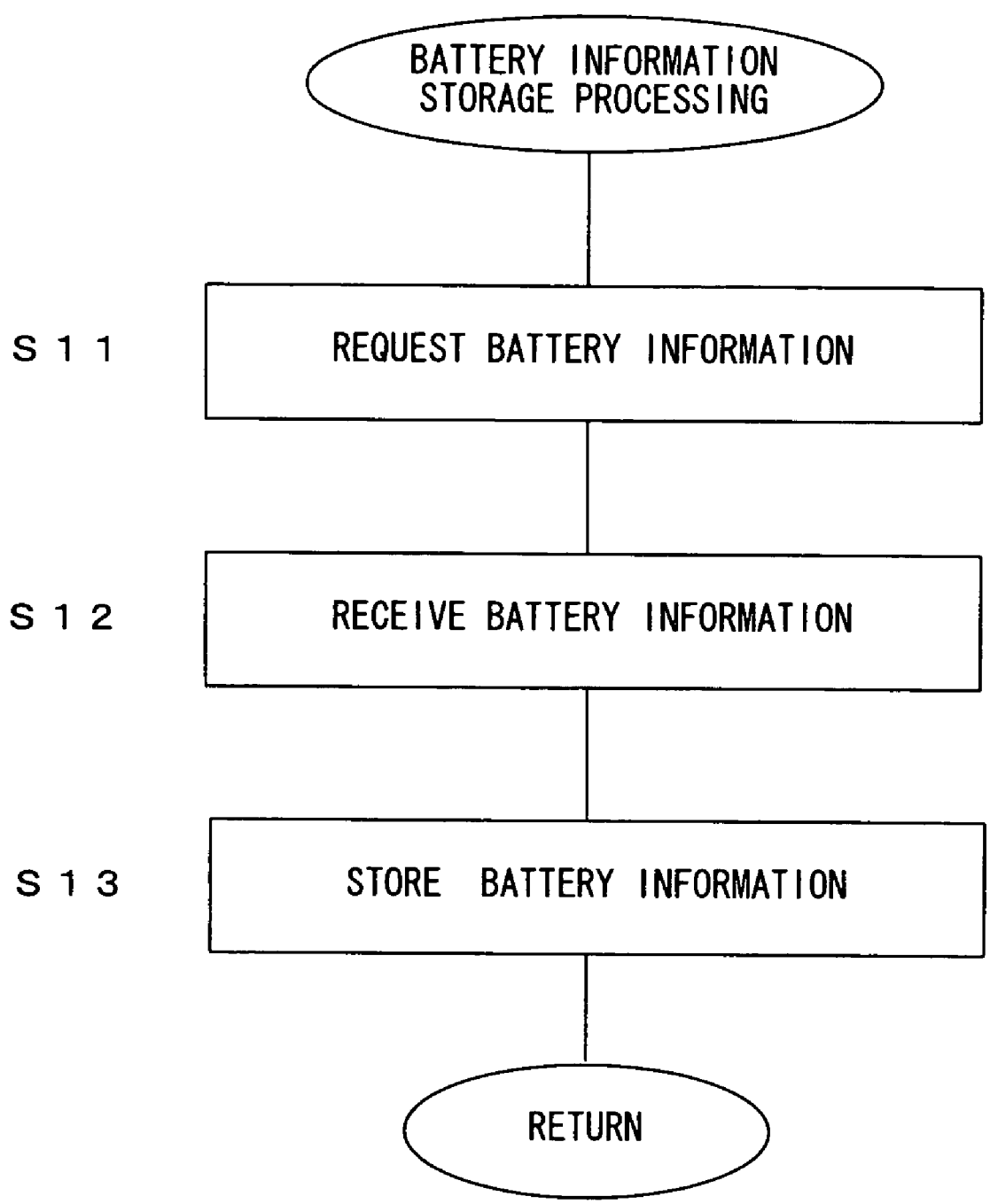

BATTERY CAPACITY DISPLAY DEVICE AND CAMERA

INCORPORATION BY REFERENCE

The disclosures of the following priority applications are herein incorporated by reference:
Japanese Patent Application No. 2003-276643 filed Jul. 18, 2003; and
Japanese Patent Application No. 2003-276644 filed Jul. 18, 2003.

BACKGROUND OF THE INVENTION

1. Field of the Invention

The present invention relates to a battery capacity display device for an electronic apparatus driven on battery power and a camera.

2. Description of Related Art

In an electronic apparatus driven on battery power, the extent to which the battery has become depleted is checked by detecting the battery voltage (see Japanese Laid Open Patent Publication No. H 9-236852). The battery power available in the electronic apparatus needs to be checked by detecting of the battery voltage while a predetermined load current is flowing from the battery.

Also, there are electronic still cameras in the known art that first store data of an image having been photographed into a storage buffer and then transfer and record the data in the storage buffer into a recording medium such as a memory card. If the remaining capacity in the battery becomes lower than a predetermined level while the image data in the storage buffer are being recorded into the recording medium in such a camera, the image data in the storage buffer can no longer be recorded into the recording medium and furthermore, the data in the storage buffer are lost. Accordingly, Japanese Laid Open Patent Publication No. H 11-355700 discloses an electronic camera that supplies backup power in order to hold the data in the storage buffer.

SUMMARY OF THE INVENTION

However, the correct remaining battery power cannot be displayed in the structure disclosed in Japanese Laid Open Patent Publication No. H 9-236852 until a load is applied to the battery by performing an operation following an electronic apparatus startup, i.e., until a specific length of time elapses after starting up the electronic apparatus.

Also, the structure disclosed in Japanese Laid Open Patent Publication No. H 11-355700 requires two power supply systems, i.e., the main source and the backup source, in order to hold the data in the recording buffer.

According to the 1st aspect of the present invention, a battery capacity display device for an electronic apparatus, comprises: a nonvolatile storage unit that stores information related to a remaining capacity in a rechargeable battery output from a battery module having the rechargeable battery and an arithmetic operation unit that calculates the information related to the remaining capacity in the rechargeable battery based upon a value of an electrical current flowing to the rechargeable battery; a display unit that displays the remaining capacity in the rechargeable battery based upon the information related to the remaining capacity; and a display control unit that controls the display unit so as to display the remaining capacity based upon the information related to the remaining capacity stored at the storage unit at least until the information related to the remaining capacity is output from the battery module following a startup of the electronic apparatus.

According to the 2nd aspect of the present invention, in the battery capacity display device for an electronic apparatus according to the 1st aspect, it is preferred that the information related to the remaining capacity includes the remaining capacity itself or a discharged capacity in the rechargeable battery.

According to the 3rd aspect of the present invention, in the battery capacity display device for an electronic apparatus according to any one of the 1st-2nd aspects, it is preferred that the battery module outputs the latest information related to the remaining capacity over a predetermined time interval; and the display unit displays the remaining capacity in the rechargeable battery based upon the latest information related to the remaining capacity.

According to the 4th aspect of the present invention, in the battery capacity display device for an electronic apparatus according to any one of the 1st-3rd aspects, it is preferred that the startup includes a startup effected in an operation OFF state and a startup effected in a power saving operation state.

According to the 5th aspect of the present invention, in the battery capacity display device for an electronic apparatus according to any one of the 1st-4th aspects, it is preferred that the display control unit controls the display unit so as to display the remaining capacity in the rechargeable battery based upon the information related to the remaining capacity stored at the storage unit before entering a state prior to the startup of the electronic apparatus.

According to the 6th aspect of the present invention, in the battery capacity display device for an electronic apparatus according to any one of the 1st-5th aspects, it is preferred that the display control unit controls the display unit so as to perform a display different from a display of the remaining capacity when the battery module becomes newly loaded into the electronic apparatus, at least until the information related to the remaining capacity is output from the battery module following the startup of the electronic apparatus.

According to the 7th aspect of the present invention, in the battery capacity display device for an electronic apparatus according to any one of the 1st-6th aspects, it is preferred that the display control unit controls the display unit to perform a display different from a display of the remaining capacity when the electronic apparatus having been operating on a current supplied from an external source is switched to operate on a current supplied from the battery module, a least until the information related to the remaining capacity is output from the battery module following the switch-over.

According to the 8th aspect of the present invention, a camera comprises: a battery capacity display device for an electronic apparatus according to any one of the 1st-7th aspects; and a photographing unit that allows a new photographing operation at least until the information related to the remaining capacity is output from the battery module following the startup.

According to the 9th aspect of the present invention, a camera comprises: a battery capacity display device for an electronic apparatus according to any one of the 1st-7th aspects; and a photographing unit that disallows a new photographing operation at least until the information related to the remaining capacity is output from the battery module following the startup.

According to the 10th aspect of the present invention, an electronic camera comprises: a remaining capacity obtaining unit that obtains information related to a remaining capacity in a battery that drives the electronic camera; a storage unit that stores photographed image data; a transfer/recording unit that transfers and records the image data stored in the storage unit into a recording medium; a power information calculation unit that calculates a power required while the transfer/recording unit is engaged in transfer and recording processing; and a control unit that allows a start of another photographing operation if the remaining capacity in the battery based upon the obtained information related to the remaining capacity in the battery is equal to or greater than a value of the power calculated by the power information calculation unit and disallows the start of another photographing operation if the remaining capacity in the battery is smaller than a value of the calculated power.

According to the 11th aspect of the present invention, in the electronic camera according to the 10th aspect, it is preferred that: there is further provided a connection unit that connects a battery module having a rechargeable battery and an arithmetic operation unit that calculates information related to a remaining capacity in the rechargeable battery based upon a value indicating a current flowing to the rechargeable battery; and the remaining capacity obtaining unit obtains the information related to the remaining capacity in the battery from the battery module connected to the connection unit.

According to the 12th aspect of the present invention, in the electronic camera according to the 11th aspect, it is preferred that: the battery module further includes a temperature detection unit that detects a temperature of the rechargeable battery; and the arithmetic operation unit corrects the information related to the remaining capacity in the rechargeable battery calculated thereby in correspondence to the temperature detected by the temperature detection unit.

According to the 13th aspect of the present invention, in the electronic camera according to any one of the 10th-12th aspects, it is preferred that: there is further provided a data size setting unit that sets at least either a data size of image data to be recorded in to the recording medium or whether or not compression processing is to be executed in response to a setting operation; and the power information calculation unit calculates the required power based upon the image data size or whether or not the compression processing is to be executed set by the data size setting unit and a storage capacity of the storage unit.

According to the 14th aspect of the present invention, an electronic camera comprises: a remaining capacity obtaining unit that obtains information related to a remaining capacity in a battery that drives the electronic camera; a storage unit that stores photographed image data; a transfer/recording unit that transfers and records the image data stored in the storage unit into a recording medium; and a control unit that allows a start of another photographing operation if the remaining capacity in the battery based upon the obtained information related to the remaining capacity in the battery is equal to or greater than a value of a power required while image data corresponding to a single frame are transferred and recorded by the transfer/recording unit and disallows the start of another photographing operation if the remaining capacity in the battery is smaller than the value of the required power.

According to the 15th aspect of the present invention, in the electronic camera according to the 14th aspect, it is preferred that: there is further provided a connection unit that connects a battery module having a rechargeable battery and an arithmetic operation unit that calculates information related to a remaining capacity in the rechargeable battery based upon a value indicating a current flowing to the rechargeable battery; and the remaining capacity obtaining unit obtains the information related to the remaining capacity in the battery from the battery module connected to the connection unit.

BRIEF DESCRIPTION OF THE DRAWINGS

FIG. 2A shows that the remaining capacity is 80% to 100%, FIG. 2B that the remaining capacity is 60% to 80%, FIG. 2C that the remaining capacity is 40% to 60%, FIG. 2D that the remaining capacity is 20% to 40%, FIG. 2E that the remaining capacity is 10% to 20%, and FIG. 2F that the remaining capacity is less than 10%;

FIG. 3 shows a flowchart of the battery information storage processing executed at the camera controller;

DESCRIPTION OF PREFERRED EMBODIMENT(S)

The following is an explanation of a preferred embodiment of the present invention, given in reference to the drawings.

First Embodiment

Figure 1:
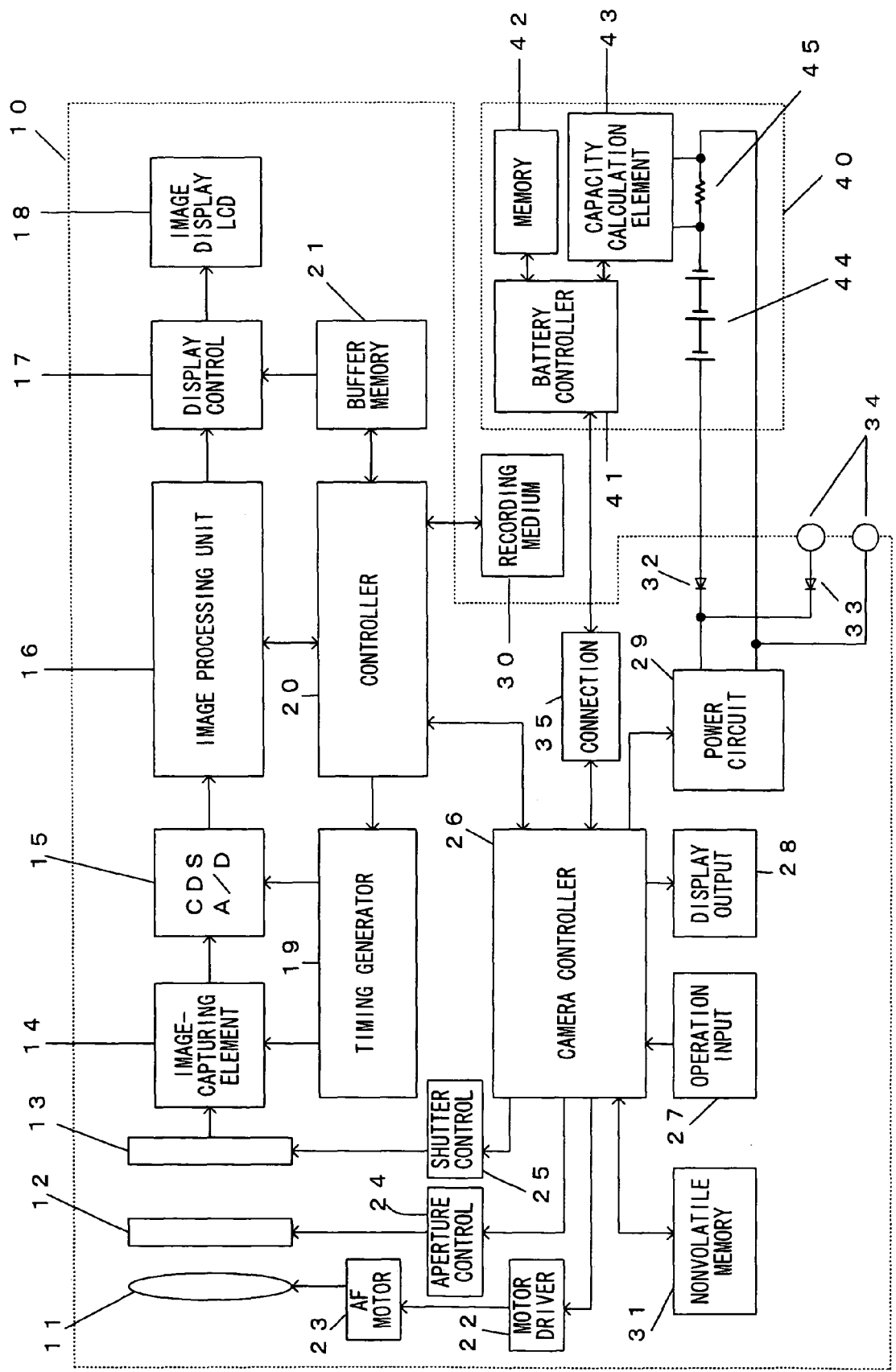
FIG. 1 shows a block diagram of the structure adopted in an electronic still camera.
Figure 2A:
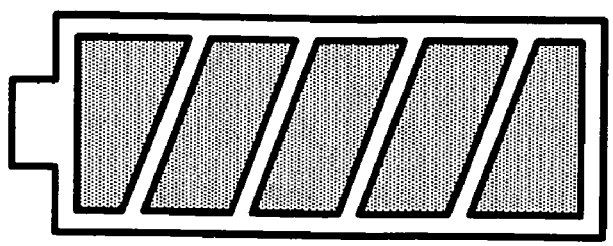
FIGS. 2A thorough 2F show examples of the remaining capacity display.
Figure 2B:
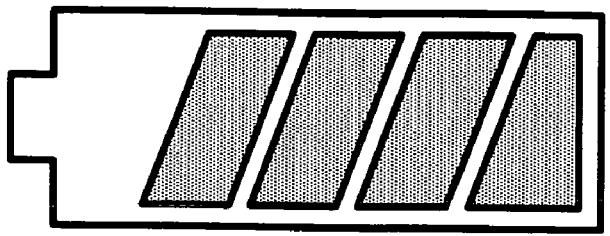
Figure 2C:
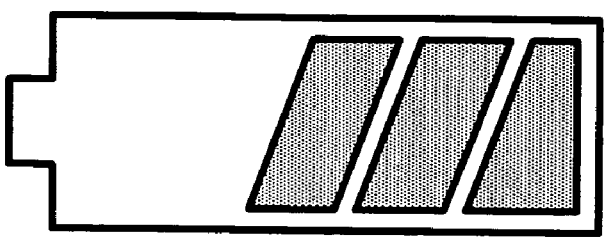
Figure 2D:
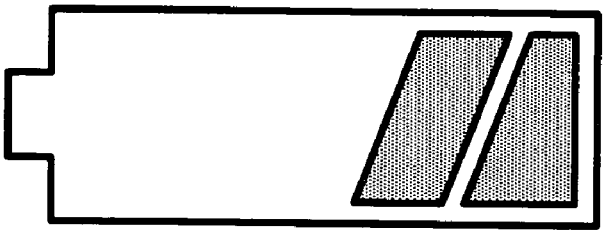
Figure 2E:
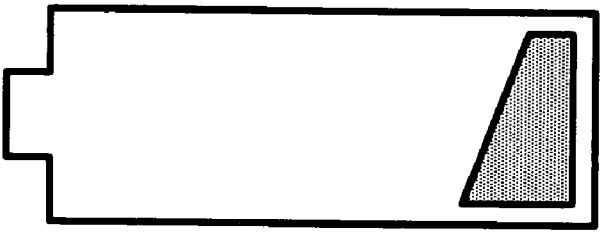
Figure 2F:
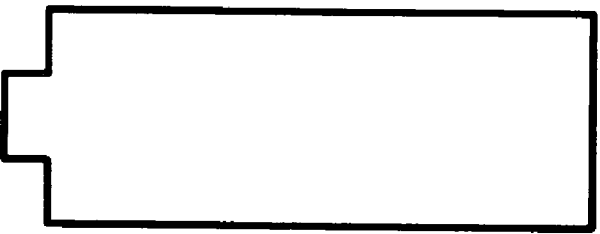

FIG. 1 is a block diagram of the structure adopted in an electronic still camera 10 achieved in the first embodiment of the present invention. A camera controller 26 in FIG. 1 is constituted with a microcomputer and the like. The camera controller 26 executes predetermined arithmetic operations by using signals input thereto from the individual blocks to be detailed later and outputs control signals to the blocks based upon the arithmetic operation results. A controller 20 outputs control signals for various blocks in the image-capturing system in response to commands from the camera controller 26.

An image-capturing element 14 is constituted of a CCD image sensor or the like. The image-capturing element 14 captures an image formed with subject light having passed through a photographic lens 11, an aperture 12 and a shutter 13, and outputs an image-capturing signal to a CDS·A/D conversion circuit 15.

The CDS·A/D conversion circuit 15 removes noise from the image-capturing signal through correlated double sampling (CDS) and then converts the analog image-capturing signal to a digital signal. The image-capturing elements 14 and the CDS·A/D conversion circuit 15 are individually driven with predetermined operational timing by drive signals output from a timing generator 19. The timing generator 19 starts and stops the output of drive signals in response to commands issued by the controller 20.

An image processing unit 16 executes specific types of image processing on the digitized signals in response to commands from the controller 20. The image processing includes white balance (WB) adjustment processing, compression processing for compressing image data in a predetermined format (eg., JPEG) and decompression processing for decompressing data having undergone the compression processing. A display control circuit 17 executes the processing necessary to display an image reproduced by using image data at an image display LCD 18. At the image display LCD 18, the reproduced image is displayed based upon a display control signal output from the display control circuit 17.

In a buffer memory 21, to which image data having undergone the signal processing at the image processing unit 16 are sequentially input, the data are stored on a temporary basis. The image data stored in the buffer memory 21 on a temporary basis are recorded into a recording medium 30 constituted of, for instance, a detachable flash memory.

While the contents recorded in the buffer memory 21 become lost once the power supply stops, the buffer memory 21 has an advantage in that data written into the buffer memory 21 more quickly than into the recording medium 30. In other words, the contents recorded in the recording medium 30 are held even while no power is supplied, but it takes longer to write data into the recording medium 30 than into the buffer memory 21. Accordingly, the controller 20 implements control so as to write image data obtained after starting the photographing sequence into the buffer memory 21 at high speed and, at the same time to transfer and record data stored in the buffer memory 21 into the recording medium 30 at a rate corresponding to the write speed of the recording medium 30. As a result, it is possible to photograph an image immediately in response to a shutter release operation even before completing the recording of the image data corresponding to the preceding photographic frame into the recording medium 30. The timing with which the buffer memory 21 is accessed and the timing with which the recording medium 30 is accessed are individually controlled by the controller 20.

Operation signals corresponding to specific operations are output to the camera controller 26 from an operation input member 27 which includes various operating members such as a shutter release button (not shown). A display output unit 28 displays the remaining capacity in a battery pack 40 which is to be detailed later, the shutter speed, the aperture value and exposure information in response to a command from the camera controller 26.

A motor driver 22 implements drive control on an AF motor 23 in response to a command issued by the camera controller 26. The AF motor 23 drives a focus lens (not shown) constituting the photographic lens 11 forward/backward along the optical axis. An aperture control actuator 24 drives the aperture 12 so as to achieve a specific aperture value in response to a command issued by the camera controller 26. A shutter control magnet 25 individually controls the front curtain and the rear curtain (not shown) of the shutter 13 so as to hold/release them independently of each other.

A power circuit 29 converts a battery voltage supplied from the battery pack 40 or a DC voltage supplied from an external DC source to a voltage needed at the various blocks within the electronic camera 10. The power circuit 29 comprises a DC/DC converter.

The battery pack 40 includes rechargeable (or secondary) battery cells 44, a battery controller 41, a memory 42, a capacity calculation element 43 and a resistor 45. As the battery pack 40 is loaded into the electronic camera 10 via a connection unit 35, the voltage achieved with the rechargeable battery cells 44 is applied to the power circuit 29 via a diode 32. The connection unit (interface unit) 35 comprise contacts to which power is supplied and contacts through which signals are transmitted and received, and a structure by which the battery pack 40 can be physically held. As the main switch of the electronic camera 10 is turned on in this state, the battery controller 41 engages in communication with the camera controller 26. In response to a signal transmitted from the camera controller 26 to the battery controller 41 requesting battery information, the battery controller 41 transmits the battery information to the camera controller 26. The battery information which indicates the remaining capacity in the rechargeable battery cells 44 is stored in the memory 42.

The capacity calculation element 43 detects the value of the voltage generated at the two ends of the resistor 45 and ascertains the level of the current (a discharge current in this case) flowing to the rechargeable battery cells 44 by dividing the detected voltage by the resistance value at the resistor 45. The capacity calculation element 43 calculates the consumed capacity (consumption amount information) at the rechargeable battery cells 44 through a time integration of the current value, and transmits the results of the calculation to the battery controller 41. The consumed capacity may be expressed in units of, for instance, mAH. The battery controller 41 subtracts the consumed capacity from the total capacity of the rechargeable battery cells 44 stored in advance in the memory 42 and thus calculates the remaining capacity (remaining capacity=total capacity−consumed capacity). Information indicating the remaining capacity is stored into the memory 42, and is updated over specific time intervals with which the remaining capacity is recalculated.

The total capacity of the rechargeable battery cells 44 is stored into the memory 42 when the rechargeable battery cells 44 are charged. The battery pack 40 is mounted at a charger (not shown) to be charged. The capacity calculation element 43 detects the value of the voltage generated at the two ends of the resistor 45 and ascertains the level of the current (a charge current in this case) flowing to the rechargeable battery cells 44 by dividing the detected voltage by the resistance value at the resistor 45. The capacity calculation element 43 calculates the charged capacity at the rechargeable battery cells 44 through a time integration of the current value, and transmits the results of the calculation to the battery controller 41. The charged capacity may be expressed in units of mAH. The battery controller 41 stores the charged capacity calculated at the end of the charge into the memory of 42 and sets this value as the total capacity of the rechargeable battery cells 44 (total capacity=remaining capacity prior to charge+charged capacity).

Upon receiving the battery information from the battery controller 41, the camera controller 26 outputs a command for the display output unit 28 to display the remaining capacity in the battery pack 40 based upon the received battery information. FIGS. 2A through 2F present examples of the remaining capacity display. The display in FIG. 2A indicates that the remaining capacity is 80% to 100%, the display in FIG. 2B indicates that the remaining capacity is 60% to 80%, the display in FIG. 2C indicates that the remaining capacity is 40% to 60%, the display in FIG. 2D indicates that the remaining capacity is 20% to 40%, the display in FIG. 2E indicates that the remaining capacity is 10% to 20% and the display in FIG. 2F indicates that the remaining capacity is less than 10%.

The electronic camera 10 can also be driven on DC power supplied from the outside by connecting an external power input terminal 34 to an external DC source (not shown) such as an AC adapter and applying a DC voltage from the external DC source to the power circuit 29 via a diode 33. The level of the voltage originating from the external DC source is set higher than the level of the voltage supplied from the battery pack 40. As the external DC source is connected to the electronic camera 10 and an external source detection signal (not shown) is input in response, the camera controller 26 assumes that the battery pack 40 is not currently used and accordingly, stops the communication with the battery controller 41 at the battery pack 40. When the external source detection signal is no longer input, the camera controller 26 assumes that the camera is now being driven with the battery pack 40 and starts communicating with the battery controller 41 at the battery pack 40.

The camera controller 26 starts communication with the battery controller 41 at the battery pack 40 when a signal indicating an ON operation of the main switch at the electronic camera 10 is input and when an operation signal is input from the operation input member 27 during power-saving operation at the electronic camera 10, as well as when the external source detection signal is no longer input. The term "power saving operation" refers to an operating mode in which the power consumption is reduced by stopping the camera operations except for the minimum processing that is required such as the operation signal detection when no operation signal has been input from the operation input member 27 over a predetermined length of time. If an operation signal from the operation input member 27 is detected in the power saving operation mode, the camera returns to the normal operating state.

A non volatile memory 31 holds stored contents even after the power supply stops. The camera controller 26 stores the battery information it has received from the battery controller 41 into the nonvolatile memory 31 and updates the memory contents each time a new set of battery information is received.

The present invention is characterized in the remaining capacity display at the display output unit 28 brought up immediately after the camera controller 26 in the electronic camera 10 described above starts communication with the battery controller 41 at the battery pack 40.

FIG. 3 presents a flowchart of battery information storage processing executed by the camera controller 26. The processing in FIG. 3 is repeatedly executed over a predetermined time interval while the electronic camera 10 is in use and running on power supplied by the battery pack 40 (while the camera controller 26 and the battery controller 41 are in communication with each other).

In step S11 in FIG. 3, the camera controller 26 issues a request for the battery information to the battery controller 41, and then the operation proceeds to step S12. In step S12, the camera controller 26 receives the battery information from the battery controller 41 before the operation proceeds to step S13. In step S13, the camera controller 26 stores the received battery information into the nonvolatile memory 31 (updates the memory contents) and then the processing in FIG. 3 ends. Thus, the latest battery information is stored in the nonvolatile memory 31.

Normally, the current consumed in an electronic apparatus fluctuates significantly depending upon the operating state of the electronic apparatus. For instance, when the shutter release button (not shown) is pressed half way down, the AF motor 23 is driven, resulting in an increase in the current in the electronic camera. Then, as a full press operation is performed at the shutter release button, the photographing sequence starts, further increasing the consumption current. As the photographing operation starts, power is supplied to the aperture control actuator 24, the shutter control magnet 25, the image-capturing element 14 and the like, and subsequently, the consumption current fluctuates during the photographing processing sequence until all image data stored in the buffer memory 21 are transferred and written into the recording medium 30.

Since the consumption current fluctuates as described above, the value indicating the consumed capacity of the rechargeable battery cells 44 calculated based upon the momentary value of the voltage generated at the two ends of the resistor 45 of the battery pack 40 is likely to contain an error. Accordingly, the capacity calculation element 43 in the battery pack 40 calculates an average consumed capacity by integrating the current value over a predetermined length of time (eg., 2 sec). For this reason, it takes the battery controller 41 at least 2 seconds to calculate the remaining capacity in the battery cells 44 (remaining capacity=total capacity−consumed capacity) and update the memory contents in the memory 42.

Since a specific length of time (2 sec in the example explained above) is needed for the battery controller 41 to calculate the remaining capacity in the battery cells 44, the camera controller 26 does not receive battery information immediately after starting communication with the battery controller 41 at the battery pack 40. The camera controller 26 displays the remaining capacity based upon the battery information stored in the nonvolatile memory 31 until new battery information is transmitted from the battery controller 41. During this time, photographing is allowed.

Figure 4:
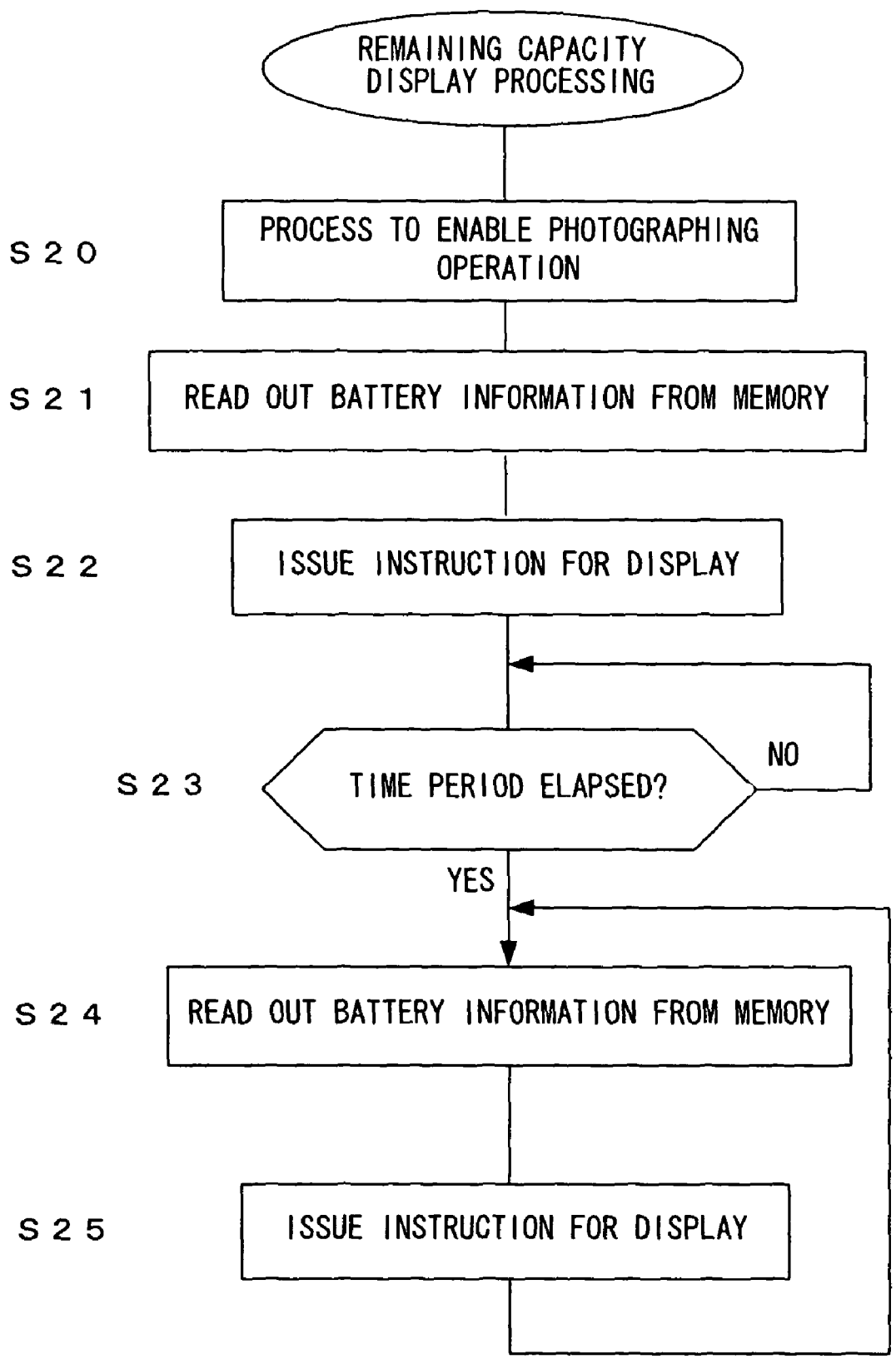
FIG. 4 shows a flowchart of the remaining capacity display processing executed at the camera controller.

FIG. 4 presents a flowchart of remaining capacity display processing executed immediately after the communication between the camera controller 26 and the battery controller 41 starts. The processing in FIG. 4 is started up in response to an ON operation of the main switch (not shown) at the electronic camera 10 or in response to an operation of the operation input member 27 while the electronic camera 10 is in the power saving operation mode. In step S20 in FIG. 4, the camera controller 26 performs initial setting to enable photography with the camera. Next, the camera controller 26 reads out the battery information stored in the nonvolatile memory 31 and then the operation proceeds to step S22.

In step S22, the camera controller 26 issues an instruction for the display output unit 28 to display the remaining capacity based upon the battery information having been read out, and then the operation proceeds to step S23. In response, the remaining capacity which was calculated when the electronic camera 10 was last used is displayed at the display output unit 28. In step S23, the camera controller 26 makes a decision as to whether or not a preset time period has elapsed. If the preset time period (set greater than the length of time required to calculate the remaining capacity in the battery pack 40 (2 sec in the example) has elapsed since the start of the processing shown in FIG. 4, the camera controller 26 makes an affirmative decision in step S23 and the operation proceeds to step S24, whereas the camera controller 26 makes a negative decision in step S23 if the preset time period has not elapsed and the decision-making processing is repeatedly executed. Thus, even though no new battery information is transmitted from the battery controller 41 before the preset period elapses, the remaining capacity display is sustained by using the past battery information saved in the nonvolatile memory 31.

In step S24, and the camera controller 26 reads out the battery information stored in the nonvolatile memory 31 and the operation proceeds to step S25. By this point, the battery information has been updated with the battery information newly received from the battery controller 41. In step S25, the camera controller 26 issues an instruction for the display output unit 28 to display the remaining capacity based upon the battery information having been read out, and then the operation returns to step S24. The memory contents in the nonvolatile memory 31 are updated with the most recent battery information through the processing shown in FIG. 3 once it is decided in step S23 that the predetermined time period has elapsed, the remaining capacity can be displayed by using the most recent battery information.

The following advantages are achieved by adopting the embodiment explained above.

(1) The camera controller 26 saves in the nonvolatile memory 31 the battery information indicating the remaining capacity, which has been calculated and transmitted by the battery controller 41 at the battery pack 40. When the electronic camera 10 is started up (in response to an ON operation of the main switch (not shown) at the camera in an OFF state or in response to an operation of the operation input member 27 in the power saving operation mode), the camera controller 26 displays the remaining capacity (step S22) by using the battery information saved in the nonvolatile memory 31. Since the battery cells 44 do not become discharged to any significant extent while the main switch is in an OFF state (operation OFF state) or while the camera is set in the power saving operation mode, the battery information saved in the nonvolatile memory 31 can be regarded to indicate a remaining capacity substantially equal to the capacity remaining at the startup of the electronic camera 10, unless the camera has been left unused for an extended period of time. Thus, even though no new battery information is transmitted from the battery controller 41, the correct remaining capacity can be displayed immediately upon startup. It is to be noted that even while no new battery information is transmitted from the battery controller 41, photographing is allowed.

(2) When the predetermined time period has elapsed following startup of the electronic camera 10 (when an affirmative decision is made in step S23), the camera controller 26 displays the remaining capacity based upon the battery information having been newly transmitted from the battery controller 41 (step S25). Thus, the updated remaining capacity can be displayed at all times.

(3) Battery information newly transmitted from the battery controller 41 while the electronic camera 10 is engaged in operation on the power supplied from the battery pack 40 is used to update the memory contents in the nonvolatile memory 31 over a predetermined time interval (step S13). As a result, the information indicating the remaining capacity stored in the nonvolatile memory 31 is constantly updated.

A photographing start in the electronic camera 10 explained above may be disallowed even when a shutter release operation is performed until the updated remaining capacity is displayed based upon the battery information newly transmitted from the battery controller 41 (step S25). In this case, the camera controller 26 should determine whether to allow/disallow the photographing start.

Figure 9:
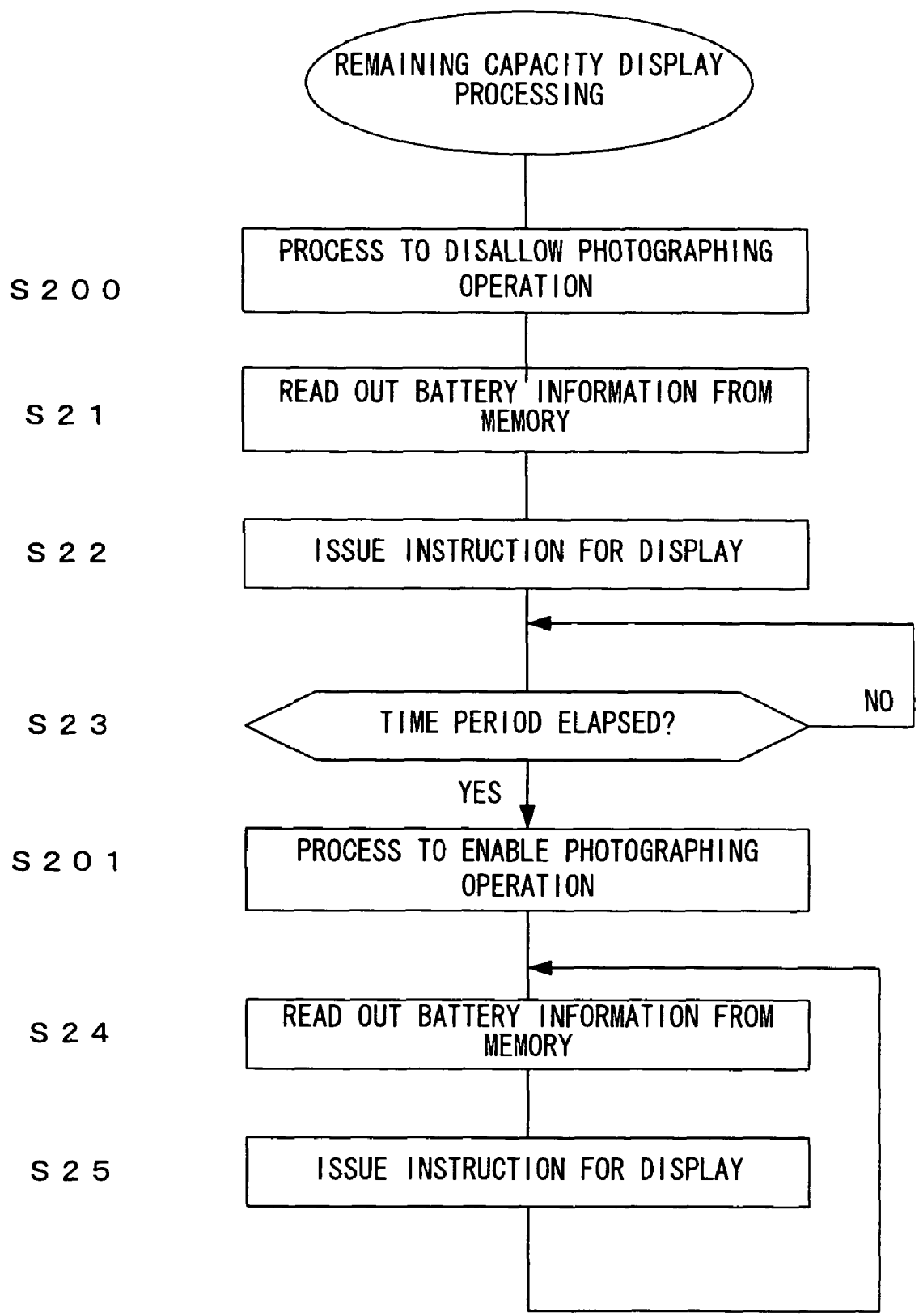
FIG. 9 shows a flowchart of the remaining capacity display processing executed at the camera controller in case of disallowing photography.

FIG. 9 shows a flowchart of the remaining capacity display processing executed at the camera controller in case of disallowing or inhibiting photography. In step S200, it is processed to disallow photographing operation with the camera, and in step S201 it is processed to enable photographing operation with the camera. Since other steps are similar to those of above FIG. 4, explanations are omitted.

In the example explained above, the remaining capacity is displayed before the preset time period elapses by using the battery information saved in the nonvolatile memory 31. Alternatively, the remaining capacity may be displayed before the preset time period elapses based upon battery information saved in the memory 42 at the battery pack 40. In this case, the camera controller 26 receives from the battery controller 41 the battery information saved in the memory 42 in step S21, and then the operation proceeds to step S22. The battery controller 41, upon receiving the request for battery information from the camera controller 26 before it has calculated the remaining capacity in the battery cells 44, transmits the battery information saved in the memory 42 as an initial value to the camera controller 26. After the remaining capacity in the battery cells 44 is calculated, the battery controller 41 transmits the latest battery information indicating the new value to the camera controller 26.

A RAM may be utilized in place of the nonvolatile memory 31. Since the battery voltage is applied to the power circuit 29 as long as the battery pack 40 is loaded in the electronic camera, the RAM can be supplied with power via the power circuit 29 even while the main switch (not shown) of the electronic camera is in an OFF state. Thus, the remaining capacity can be displayed based upon the battery information saved in the RAM in a similar manner without using the nonvolatile memory 31.

If the battery pack 40 has been replaced, the camera controller 26 issues an instruction for the display output unit 28 to assume a display mode different from that for the regular remaining power display, instead of displaying the remaining capacity based upon the battery information saved in the nonvolatile memory 31 before the preset time period elapses. In the different display mode, the individual display segments in FIG. 2A may, for instance, be made to flash. This prevents a display of the remaining battery power based upon the battery information corresponding to the wrong battery pack 40 and informs the user that the remaining capacity check is in progress. During this time, photographing is disallowed. It is to be noted that power should be supplied to the camera controller 26 from the power circuit 29 even when the main switch (not shown) of the electronic camera 10 is in an OFF state so as to enable the camera controller 26 to judge that the battery pack 40 is being replaced as the current supply stops.

In addition, the camera controller 26 issues an instruction for the display output unit 28 to assume a display mode different from that for the regular remaining power display for a predetermined length of time when an input of the external source detection signal stops as well. If the battery pack 40 is replaced while the electronic camera 10 is being driven on a current supplied from the external DC source, the current supply is not interrupted and the camera controller 26 cannot detect that the battery pack 40 is being replaced. Accordingly, a display mode different from that for the regular remaining power display is assumed until new battery information is received from the battery controller 41 of the battery pack 40 after the input of the external source detection signal stops so as to alert the user that the remaining capacity check is in progress. During this time, photographing is disallowed.

While an explanation is given above on an example in which the present invention is adopted in an electronic camera, the present invention may also be adopted in a film camera, a portable telephone, a PDA, a personal computer and the like as long as rechargeable batteries are used as a power source.

Second Embodiment

Figure 5:
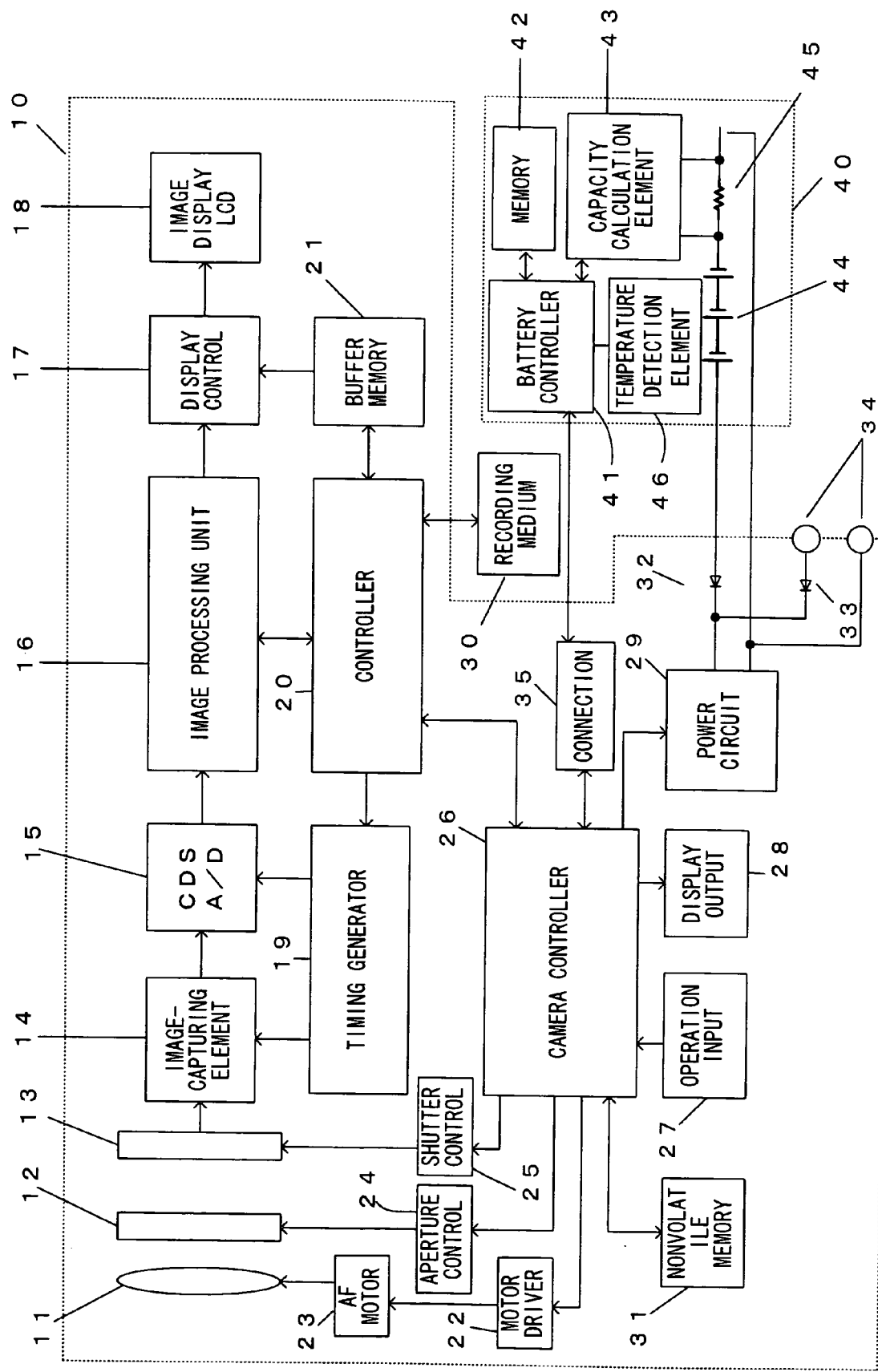
FIG. 5 shows a block diagram of the structure adopted in the electronic still camera achieved in the second embodiment.

FIG. 5 is a block diagram of the structure adopted in an electronic still camera 10 achieved in the second embodiment of the present invention. It is only different from FIG. 1 that the battery pack 40 includes a temperature detection element 46. Accordingly, an explanation of the structure adopted in the electronic still camera 10 is referred to the explanation of the first embodiment, and the explanation is omitted.

The temperature detection element 46 outputs a detection signal obtained by detecting the temperature of the rechargeable battery cells 44 to the battery controller 41.

According to the present invention, the battery capacity needed in the electronic camera 10 to transfer and record image data in the buffer memory 21 into the recording medium 30 is calculated and a further photographing operation is disallowed if the remaining capacity in the battery pack 40 is lower than the calculated battery capacity.

Figure 6:
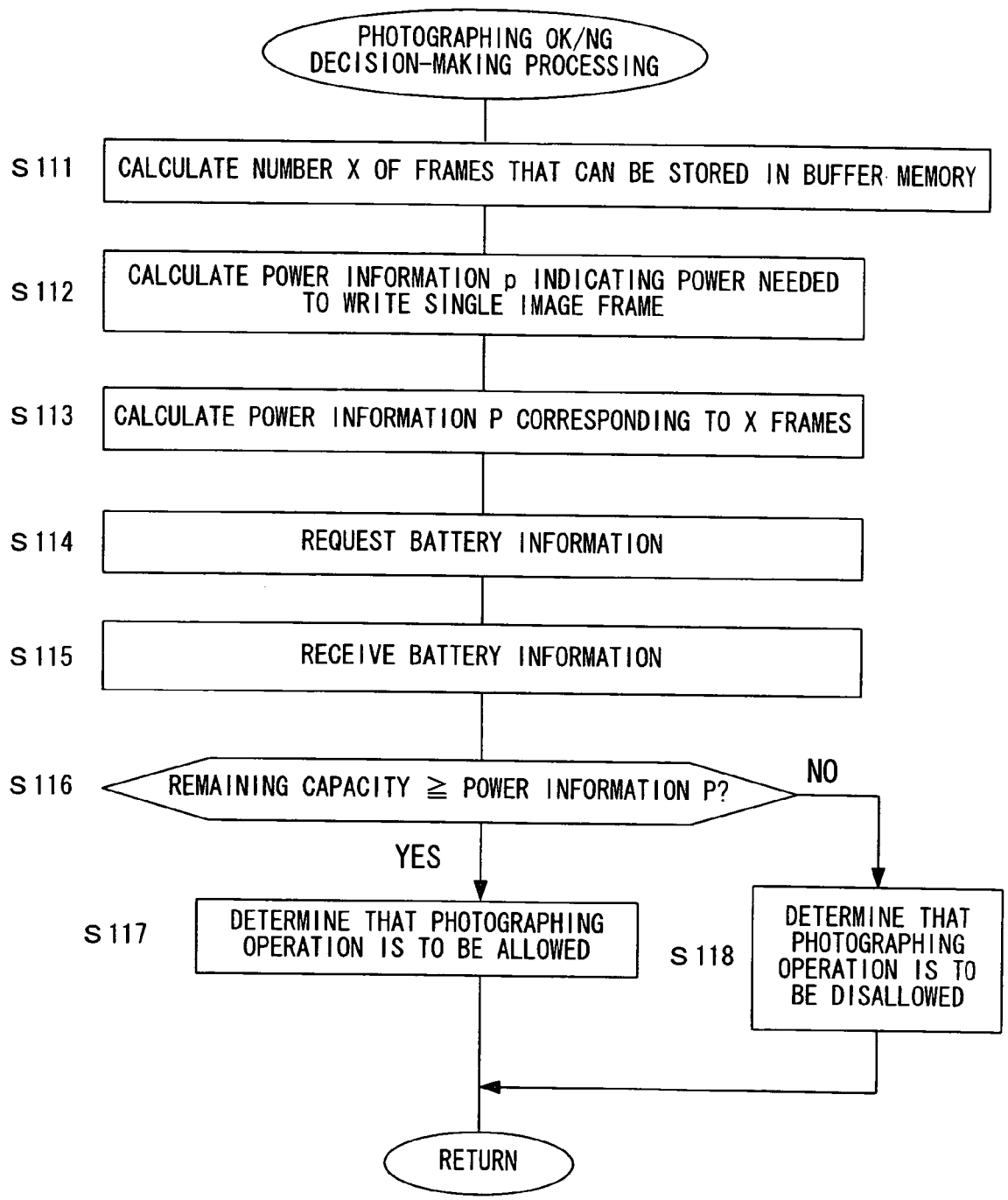
FIG. 6 shows a flowchart of the photographing OK/NG decision-making processing executed in the camera controller.

FIG. 6 presents a flowchart of photographing OK/NG decision-making processing executed in the camera controller 26. The camera controller 26 repeatedly executes the processing in FIG. 6 over a predetermined time interval after the main switch (not shown) of the camera 10 is turned on to make a decision as to whether a photographing operation is to be allowed/disallowed. If it is decided that a photographing operation is allowed through the processing shown in FIG. 6, the camera controller 26 starts a photographing sequence in response to a shutter release operation signal input through the operation input member 27. If, on the other hand, it is decided that a photographing operation is disallowed through the processing shown in FIG. 6, the camera controller 26 disallows another execution of the photographing sequence. Thus, even if a shutter release operation signal is input from the operation input member 27, the camera 10 is not engaged in a photographing operation.

In step S111 in FIG. 6, the camera controller 26 calculates the number of frames X of images that can be stored in the buffer memory 21 by using expression (1) below and then the operation proceeds to step S112.

$$X=(\text{buffer size})/(\text{file size per frame}) \quad (1)$$

The buffer size in the expression presented above is the storage capacity of the buffer memory 21, which is stored in advance in a ROM area (not shown) inside the camera controller 26. Varying file sizes per frame corresponding to different recording modes are stored in advance in the ROM area (not shown) in the camera controller 26. The camera controller 26 reads out the file size corresponding to the current recording mode setting at the camera 10 and uses the file size thus read out for substitution in expression (1).

The recording modes may include the following.
1 "RAW"; image data are recorded without undergoing the image processing
2 "TIFF"; image data having undergone the image processing are recorded in an uncompressed state
3 "FINE"; image data having undergone the image processing are recorded at a compression rate of approximately ¼
4 "NORMAL"; image data having undergone the image processing are recorded at a compression rate of approximately ⅛
5 "BASIC"; image data having undergone the image processing are recorded at a compression rate of approximately 1/16
The varying file sizes have a relationship expressed as; "RAW">"TIFF">"FINE">"NORMAL">"BASIC".

In step S112 in FIG. 6, the camera controller 26 obtains power information p indicating the amount of power required to write a single image frame by using expression (2) below, before the operation proceeds to step S113.

$$p=a\times t \quad (2)$$

In the expression above, "a" represents the current consumed in the entire camera 10 when writing an image frame into the recording medium 30 (the current supplied from the battery pack 40) and t represents the length of time required to write a single image frame into the recording medium 30.

The consumed current a changes depending upon whether the recording medium 30 is constituted of a memory or a data storage device. The camera controller 26 reads out the current value corresponding to the specific type of recording medium 30 currently loaded in the camera from the ROM area (not shown) inside the camera controller 26 where varying current values are stored in advance. The varying lengths of write operation time t are stored in advance in correspondence to the individual recording modes (i.e., the individual file sizes) in the ROM area (not shown) inside the camera controller 26. The camera controller 26 reads out the length of time t corresponding to the current recording mode setting at the camera 10 and uses the value thus read out for substitution in expression (2).

In step S113, the camera controller 26 obtains power information P corresponding to X frames through a calculation executed by using expression (3) below, and then the operation proceeds to step S114.

$$P=X\times p \quad (3)$$

For instance, when X=30 frames, the consumed current a=500 mA and the length of write operation time t=2 sec, the power information P indicates 30,000 mA sec=8.3 mAH. This indicates that as long as there is at least 8.3 mAH of battery capacity remaining in the battery pack 40, all the image data stored in the buffer memory 21 can be stored into the recording medium 30 with a high degree of reliability.

In step S114, the camera controller 26 issues a request for the battery information to the battery controller 41 before the operation proceeds to step S115. Instep S115, the camera controller 26 receives the battery information (indicating the remaining capacity) from the battery controller 41 before the operation proceeds to step S116. In step S116, the camera controller 26 makes a decision as to whether or not (remaining capacity)≧(power information P) is true. The camera controller 26 makes an affirmative decision in step S116 if (remaining capacity)≧(power information p) is true to proceed to step S117, whereas it makes a negative decision in step S116 if (remaining capacity)<(power information P) is true to proceed to step S118.

In step S117, the camera controller 26 judges that the execution of a photographing operation is to be allowed before the processing in FIG. 6 ends. In step S118, the camera controller 26 judges that the execution of a photographing operation is to be disallowed before the processing in FIG. 6 ends.

Figure 7:
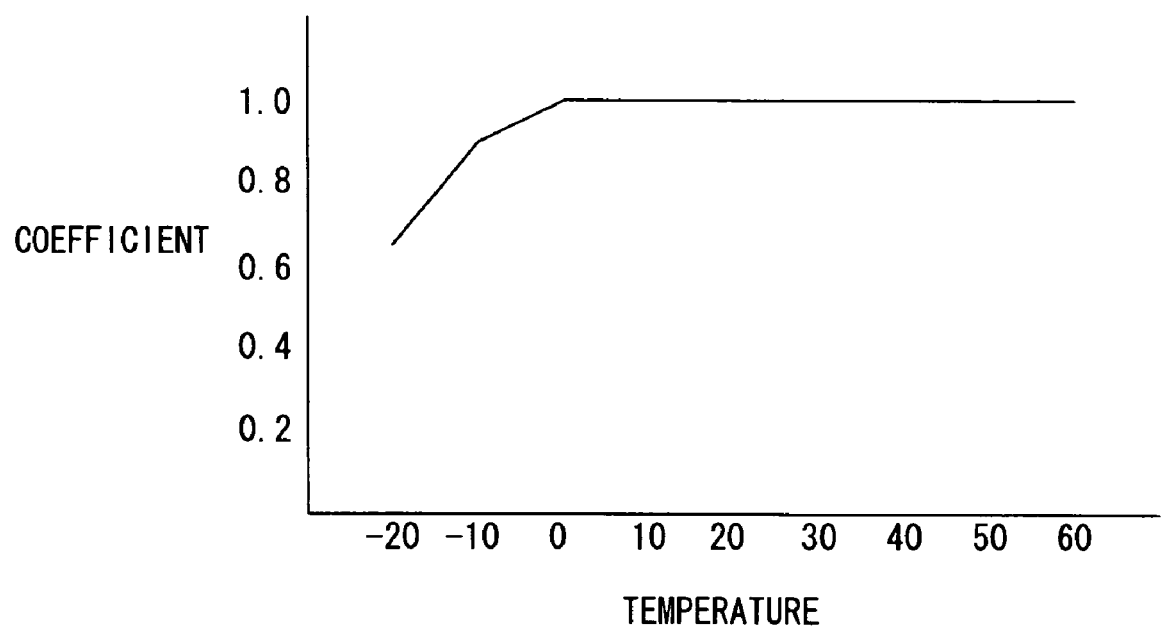
FIG. 7 shows a chart of the temperature compensation coefficient.

It is generally known that the discharge capacity of a battery is lowered as the temperature goes down. In other words, the total capacity of the battery at lower temperatures is less than the total capacity at normal temperatures. Accordingly, the battery controller 41 executes a temperature compensation to correct the total capacity by using the detection signal provided by the temperature detection element 46. FIG. 7 is a chart of the temperature compensation coefficient. In FIG. 7, the detected temperature is indicated along the horizontal axis and the temperature compensation coefficient is indicated along the vertical axis. FIG. 7 indicates that the coefficient at −10° C. is 0.9 and that the coefficient at −20° C. is 0.65, relative to the coefficient of 1 for temperatures equal to or higher than 0° C. The relationship between the detected temperature and the temperature compensation coefficient, such as that shown in FIG. 7, is stored in advance in the ROM area (not shown) within the battery controller 41 as a table or a function. The battery controller 41 reads out the temperature compensation coefficient corresponding to the detected temperature and multiplies the total capacity by the coefficient thus read out for correction. As a result, the substantial remaining capacity at a lower temperature can be ascertained. It is to be noted that the temperature compensation coefficient may be used either as the multiplier with which the remaining capacity is multiplied or the divisor by which the consumed capacity is divided.

The following advantages are achieved by adopting the second embodiment described above.

(1) The camera controller 26 obtains the power information P indicating the power needed to transfer and record all the data in the buffer memory 21 in to the recording medium 30 through a calculation executed based upon the current recording mode setting (i.e., the file size per frame), the specific type of recording medium 30 being used (i.e., the value of the current needed for a write) and the buffer size at the buffer memory 21. In addition, the camera controller 26 receives the battery information (indicating the remaining capacity in the battery pack 40) from the battery controller 41 and determines that the execution of a photographing operation is allowed (step S117) if (remaining capacity)≧(power information P) is true (if an affirmative decision is made in step S116). However, it determines that the execution of a photographing operation is disallowed (step S118) if (remaining capacity)<(power information P) is true (if a negative decision is made in step S116). As a result, a further photographing operation is executed only if enough battery power for transferring and storing the image data stored in the buffer memory 21 into the recording medium 30 is left and thus, loss of data in the buffer memory 21 due to battery capacity depletion can be prevented and the recording of the data into the recording medium 30 can be completed with a high degree of reliability before the remaining battery power becomes too low, without having to add another power supply, as in the related art.

(2) Since the battery temperature is detected with the temperature detection element 46 and any deterioration in the battery capability caused by low temperatures is compensated, all the image data stored in the buffer memory 21 can be stored into the recording medium 30 with a high degree of reliability even if the substantial remaining capacity becomes lower at lower temperatures.

In the explanation provided above, the battery controller 41 transmits information indicating the actual remaining capacity to the camera controller 26 as the battery information. Alternatively, a value obtained by subtracting the value of the power information P from the actual remaining capacity may be transmitted to the camera controller 26. In such a case, the camera controller 26 transmits the power information P when requesting the battery information from the battery controller 41 in step S114. In response, the battery controller 41 calculates (remaining capacity)(power information P) and transmits the arithmetic operation results to the camera controller 26 as the battery information. Upon receiving the battery information, the camera controller 26 makes an affirmative decision in step S116 if (battery information)≧0 is true to proceed to step S117, but makes a negative decision in step S116 if (battery information)<0 is true to proceed to step S118.

The battery information P may indicate a fixed value. In this case, power information corresponding to the largest value achieved with one of the various conceivable combinations of buffer sizes, recording modes and types of recording media 30 is used as the power information P. By using a fixed value for the power information P, the volume of the arithmetic operation executed at the camera controller 26 is reduced to enable speedier photographing OK/NG decision-making processing.

Third Embodiment

Figure 8:
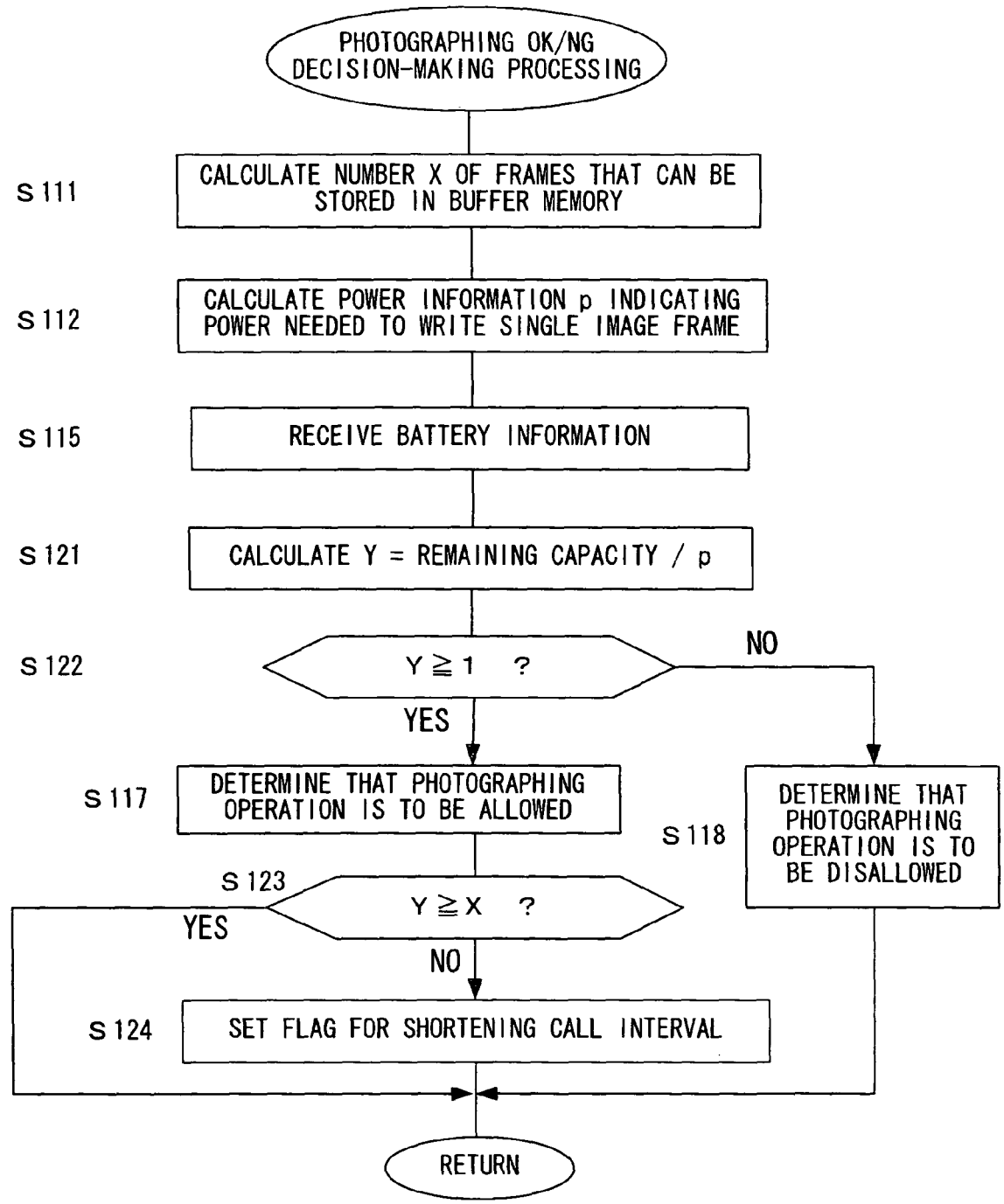
FIG. 8 shows a flowchart of the photographing OK/NG decision-making processing executed in the third embodiment.

FIG. 8 presents a flowchart of the photographing OK/NG decision-making processing executed in the third embodiment of the present invention. The camera controller 26 repeatedly executes the processing in FIG. 8 over a predetermined time interval after the main switch (not shown) of the camera 10 is turned on to determine whether the execution of a photographing operation is to be allowed/disallowed. In FIG. 8, the same step numbers are assigned to steps in which processing identical to that in FIG. 6 is executed to preclude the necessity for a repeated explanation thereof.

In step S121 in FIG. 8, the camera controller 26 calculates the number of image frames Y that can be transferred and written into the recording medium 30 with the remaining capacity in the battery pack 40 by using expression (4) below, and then the operation proceeds to step S122.

$$Y = (\text{remaining capacity})/p \quad (4)$$

p in the expression above represents the power information indicating the power required to write a single image frame which has been calculated in step S112.

In step S122, the camera controller 26 makes a decision as to whether or not Y≧1 is true. The camera controller 26 makes an affirmative decision in step S122 if Y≧1 is true to proceed to step S117, whereas it makes a negative decision in step S122 if Y<1 is true to proceed to step S118.

In step S117, the camera controller 26 determines that the execution of a photographing operation is to be allowed, and then the operation proceeds to step S123. In step S118, the camera controller 26 determines that the execution of a photographing operation is to be disallowed before the processing in FIG. 8 ends.

In step S123, the camera controller 26 makes a decision as to whether or not Y≧X is true. X represents the number of image frames that can be stored in the buffer memory 21. The camera controller 26 makes an affirmative decision in step S123 if Y≧X is true and then the processing in FIG. 8 ends. In this situation, the battery pack still have a great deal of remaining capacity and thus, enough power to allow all the data in the buffer memory 21 to be transferred and recorded into the recording medium 30 is assured.

If, on the other hand, Y<X is true, the camera controller 26 makes a negative decision in step S123 and the operation proceeds to step S124. In step S124, the camera controller 26 sets a flag for shortening the call interval for this processing, before ending the processing in FIG. 8. When the flag is set, the camera controller 26 executes the photographing OK/NG decision-making processing in FIG. 8 at least before starting each photographing sequence. As a result, when the remaining capacity in the battery becomes low (when a negative decision is made in step S123), a decision can be made to allow/disallow a photographing operation for each image frame. It is to be noted that the flag is cleared if an affirmative decision is made in step S123.

As does the second embodiment, the third embodiment explained above makes it possible to prevent any loss of data in the buffer memory 21 due to low battery capacity and to end the data recording into the recording medium 30 before the remaining battery power becomes too low, without having to add another power system as is necessary in the related art. In addition, when the remaining capacity in the battery becomes low (when a negative decision is made in step S123), the decision as to whether the execution of a photographing operation is allowed or disallowed can be made for each frame and thus, the remaining capacity in the battery pack 40 can be utilized efficiently until the available power for photographing an image frame is completely depleted.

The present invention will prove particularly effective in continuous shooting operations executed in an electronic still camera during which a large volume of image data is stored in the buffer memory 21.

While, in the above embodiments, an example that the battery pack 40 is loaded into the electronic camera 10 was explained, the present invention is not limited to this example. The structure of the battery pack 40 may be installed in the camera 10. In this case, only the rechargeable battery cells 44 may be exchangeable. It is also acceptable that the rechargeable battery cells 44 is also installed in the camera and is not exchangeable.

The above described embodiments are examples, and various modifications can be made without departing from the spirit and scope of the invention.

What is claimed is:

1. An electronic apparatus to which a battery module is detachable, power being supplied from the battery module to the electronic apparatus while the battery module is installed in the electronic apparatus, the battery module having a rechargeable battery and an arithmetic operation unit that calculates information related to a remaining capacity in the rechargeable battery based on a value of an electrical current flowing to the rechargeable battery, the electronic apparatus comprising:
   a connection unit that is configured to connect the battery module and receive the information related to the remaining capacity in the rechargeable battery;
   a control unit that receives the information related to the remaining capacity in the rechargeable battery output from the battery module via the connection unit;
   a nonvolatile storage unit that is provided in the electronic apparatus in which the battery module is installed, the nonvolatile storage unit storing the information related to the remaining capacity received by the control unit, and holding latest information related to the remaining capacity, which has been stored right before a power supply stops, even after the power supply stops;
   a display unit that displays the remaining capacity in the rechargeable battery based upon the information related to the remaining capacity; and
   a display control unit that controls the display unit so as to display the remaining capacity, in a normal remaining capacity display mode, based upon the latest information related to the remaining capacity stored at the nonvolatile storage unit at least until the information related to the remaining capacity is output from the battery module following a startup of the electronic apparatus, and controls the display unit so as to perform a display in a display mode that is different from the normal remaining capacity display mode if the battery module is replaced with another battery module.

2. An electronic apparatus according to claim 1, wherein:
   the information related to the remaining capacity includes the remaining capacity itself or a discharged capacity in the rechargeable battery.

3. An electronic apparatus according to claim 1, wherein:
   the battery module outputs the latest information related to the remaining capacity over a predetermined time interval; and
   the display unit displays the remaining capacity in the rechargeable battery based upon the latest information related to the remaining capacity.

4. An electronic apparatus according to claim 1, wherein:
   the startup includes a startup effected in an operation OFF state and a startup effected in a power saving operation state.

5. An electronic apparatus according to claim 1, wherein:
   the display control unit controls the display unit to perform a display different from a display of the remaining capacity when the electronic apparatus having been operating on a current supplied from an external source is switched to operate on a current supplied from the battery module, at least until the information related to the remaining capacity is output from the battery module following the switch-over.

6. An electronic apparatus according to claim 1, further comprising:
   a photographing unit that allows a new photographing operation at least until the information related to the remaining capacity is output from the battery module following the startup.

7. An electronic apparatus according to claim 1, further comprising:
   a photographing unit that disallows a new photographing operation at least until the information related to the remaining capacity is output from the battery module following the startup.

8. An electronic apparatus according to claim 1, wherein the display mode of the display control unit that is different from the normal remaining capacity mode is a display mode that causes the display unit to perform a flashing display.

* * * * *